(12) United States Patent
Kijima et al.

(10) Patent No.: US 7,504,313 B2
(45) Date of Patent: Mar. 17, 2009

(54) METHOD FOR FORMING PLURAL KINDS OF WELLS ON A SINGLE SEMICONDUCTOR SUBSTRATE

(75) Inventors: Masato Kijima, Kakogawa (JP); Atsushi Harikai, Ono (JP)

(73) Assignee: Ricoh Company, Ltd., Tokyo (JP)

( * ) Notice: Subject to any disclaimer, the term of this patent is extended or adjusted under 35 U.S.C. 154(b) by 216 days.

(21) Appl. No.: 11/367,644

(22) Filed: Mar. 3, 2006

(65) Prior Publication Data

US 2006/0205139 A1 Sep. 14, 2006

(30) Foreign Application Priority Data

Mar. 10, 2005 (JP) ............................. 2005-068267

(51) Int. Cl.
*H01L 21/76* (2006.01)

(52) U.S. Cl. .......................... 438/401; 438/462; 438/14

(58) Field of Classification Search .......... 257/E23.179, 257/594, 797, E23.001, E27.067; 438/401, 438/462
See application file for complete search history.

(56) References Cited

U.S. PATENT DOCUMENTS

| | | | | |
|---|---|---|---|---|
| 5,252,510 A | * | 10/1993 | Lee et al. | ..................... 438/401 |
| 5,300,797 A | * | 4/1994 | Bryant et al. | ................ 257/206 |
| 6,368,937 B1 | * | 4/2002 | Nakamura | ................... 438/401 |
| 7,005,364 B2 | * | 2/2006 | Niisoe | ......................... 438/514 |
| 2003/0127671 A1 | * | 7/2003 | Kim | ........................... 257/290 |
| 2007/0037359 A1 | * | 2/2007 | Jo | .............................. 438/401 |

FOREIGN PATENT DOCUMENTS

JP 6-45534 2/1994

* cited by examiner

*Primary Examiner*—Fernando L Toledo
*Assistant Examiner*—Jae Lee
(74) *Attorney, Agent, or Firm*—Cooper & Dunham, LLP

(57) ABSTRACT

A method is provided for forming plural kinds of wells on a single semiconductor substrate with an improved alignment accuracy and obviating the generation of step height between the wells. The method includes forming a selective etching film on the semiconductor substrate, forming openings on the selective etching film overlying a first well forming region and an alignment mark forming region using a first resist film as a mask for defining the first well forming region and the alignment mark forming region, implanting the first well forming region with a dopant of a first conductivity type and removing the first resist film, forming a second resist film to mask at least the first well forming region, having an opening overlying the alignment mark forming region larger than the opening of the selective etching film overlying the same region, and forming the alignment mark by performing an etching process using the second resist film and selective etching film as a mask.

18 Claims, 7 Drawing Sheets

METHOD FOR FORMING PLURAL KINDS OF WELLS ON A SINGLE SEMICONDUCTOR SUBSTRATE

FIELD OF DISCLOSURE

This disclosure generally relates to methods for forming semiconductor devices, and more specifically to a method for forming plural kinds of wells on a single semiconductor substrate with improved alignment accuracy simultaneously with obviating the generation of step height between the wells, and a semiconductor device formed by the method.

BACKGROUND OF DISCLOSURE

As the density of integrated circuits increases with decreasing size of component devices such as transistors, it becomes necessary to achieve precise arrangement of the devices on a semiconductor substrate with improved alignment accuracy simultaneously with obviating the generation of undue step height between plural wells in the devices during formation process.

Among previous methods for forming plural kinds of wells on a single semiconductor substrate, a couple of methods are here mentioned, one utilizing self-alignment techniques and the other using an alignment well.

The former method utilizing self-alignment techniques for forming plural kinds of wells on a single semiconductor substrate will be described herein below in reference to FIGS. 5A through 5F, which are cross-sectional views illustrating a twin-well semiconductor device during various stages in the manufacturing process according to the previous method utilizing self-alignment techniques.

In these drawings there are broadly divided into two regions from right to left an N well forming region 46 and P well forming region 48. In addition, the sentence blocks (a) through (f) in the following description will be referred to FIGS. 5A through 5F, respectively.

(a) A silicon oxide film 50 is formed on a silicon substrate 42 by the known thermal oxidation process;

a silicon nitride film 52 is subsequently formed on the silicon oxide film 50 by low pressure CVD (chemical vapor deposition);

a resist film 54 is formed on the silicon nitride film 52 having openings overlying the regions 46, 46, in which N wells are to be formed; and the portions of the silicon nitride film 52 overlying the N well forming regions 46, 46 are removed.

(b) With the use of thus patterned resist film 54 as a mask, phosphorus ions are implanted into the N well forming regions 46, 46 (as shown with "x" marks in FIG. 5B).

(c) Following the removal of the resist film 54, the surface of the structure is subjected to a thermal oxidation process using the silicon nitride film 52 as a mask for masking the P well forming region 48, whereby LOCOS (local oxidation of silicon) films 50a, 50a are formed on N well forming regions 46, 46. Thereafter, the structure is subjected to a thermal diffusion process to form N wells 56, 56.

(d) After removing the silicon nitride film 52 overlying the P well forming region 48, boron ions (as shown with "Δ" marks in FIG. 5D) are implanted into the P well forming region 48 using the LOCOS films 50a, 50a as masks.

(e) By subjecting the structure to a thermal diffusion process and subsequently removing the LOCOS oxide films 50a, 50a from the surface of silicon substrate 42, a twin-well structure is completed.

Another LOCOS oxide film 50b is formed on a predetermined region, and a gate oxide film 51 is formed on the surface of silicon substrate 42 covering the structure.

As described above, the implantation of impurities into the P well forming region 48 is performed in this alignment method after first forming N wells 56, 56, and then LOCOS oxide films 50a, 50a on the N well forming regions 46, 46 using the LOCOS oxide films 50a, 50a as masks, so that the impurities are prevented from the implantation into the P well forming region 48. As a result, this method is able to offer the advantage of reducing alignment mismatches (errors) between the N well 56 and P well 58.

In this method, however, a difference in the surface height may result between the N well 56 and P well 58 after the formation (FIG. 5E), which gives rise to a step height after the removal of the silicon oxide film 50 including LOCOS oxide film 50a. This step height in turn may cause the difficulty in focusing on a mask during aligning observation for forming gate electrodes and concomitant errors in finished measures.

In order to obviate the generation of such step height between the N well 56 and P well, another method has been disclosed to form the wells using an alignment mark (for example, Japanese Laid-Open Patent Application No. 6-45534).

The method for forming twin wells using an alignment mark will be described herein below referring to FIGS. 6A through 6E.

In these drawings there broadly divided into three regions from right to left are an alignment mark forming region 60, an N well forming region 62, and P well forming region 64. And, the sentence blocks (a) through (f) in the following description will be referred to FIGS. 6A through 6F, respectively.

(a) A silicon oxide film 66 is formed on a silicon substrate 42. Thereafter, a resist film 68 is formed with an opening overlying the alignment mark forming region 60 on the silicon oxide film 22.

By performing an anisotropic etching process on the alignment mark forming region 60 using the resist film 68 as a mask, an alignment mark 70 is formed.

(b) After removing the resist film 68, another resist film is formed having an opening overlying the N well forming region 62 on the silicon oxide film 66. Using this resist film as a mask, phosphorus ions are implanted into the N well forming region 62.

Subsequent to the removal of the resist film on the silicon oxide film 66, the structure is subjected to a thermal diffusion process to thereby form the N well 72.

(c) Still another resist film is formed having an opening overlying the P well forming region 64 on the silicon oxide film 66. Using this resist film as a mask, boron ions are implanted into the P well forming region 64.

Thereafter, the resist film is removed from the silicon oxide film 66, the structure is subjected to a thermal diffusion process, and the P well 74 is formed.

(d) After removing the silicon oxide film 66, another silicon oxide film 76 is formed on the entire surface of the structure on the silicon substrate 42, and a silicon nitride film 78 is formed on the silicon oxide film 76.

Thereafter, another resist film is formed on the silicon nitride film 78, having an opening overlying a LOCOS forming region 64.

An opening is then formed by selectively removing the portion of the silicon nitride film 78 overlying the LOCOS forming region using the resist film as a mask. The resist film is subsequently removed from the silicon nitride film 78.

(e) The surface of the structure is subjected to a thermal oxidation process using the silicon nitride film 7 as a mask, whereby a LOCOS oxide 80 is formed in the LOCOS forming region. Subsequent to the removal of the silicon nitride film 78, the semiconductor device with the twin-well structure is completed.

In the abovementioned method of forming twin wells using an alignment mark, the alignment mark 70 is first formed. And, with respect to thus formed alignment mark 70, the positioning of the N well 72, P well 74, and LOCOS oxide 80 is carried out.

In contrast to the method mentioned earlier utilizing self-alignment techniques in reference to FIGS. 6A through 6F, the present method using the alignment mark can be performed without forming the LOCOS film 50a on the N well forming region. Therefore, the difference in surface height (i.e., step height) is not generated between the N well 72 and P well 74, and no focusing error on the mask arises during the formation of gate electrodes.

In this method, however, photolithographic processes with respect to the alignment mark 70 are required each for implanting impurities into the N and P well forming regions. As a result, the number of times of aligning (positioning) increases and more alignment mismatches may arise accordingly.

As described above, the known methods for forming plural kinds of wells utilizing either self-alignment techniques or alignment mark each have encountered the difficulties in improving alignment accuracy simultaneously with obviating the generation of step height between the wells.

There is a need for an improved method for forming semiconductor devices which does not have the aforementioned disadvantages.

SUMMARY

Novel methods for forming plural kinds of wells on a single semiconductor substrate with improved alignment accuracy without generating step height between the wells, and semiconductor devices formed by the methods, are disclosed herein.

The following description is a synopsis of only selected features and attributes of the present disclosure. A more complete description thereof is found below in the Description of the Preferred Embodiments section.

A method for forming a semiconductor device comprising two kinds of wells on a single semiconductor substrate, according to an example of this disclosure, comprises the steps of:

(a) on a semiconductor substrate, which includes thereon at least an alignment mark forming region, a first well forming region, and a second well forming region;

forming a selective etching film consisting of a material having a high selective etching ratio with respect to the semiconductor substrate;

forming thereon a first resist film to expose the alignment mark forming region and first well forming region and to mask the second well forming region; and using the first resist film as a mask, selectively removing the portions of the selective etching film overlying the alignment mark forming region and first well forming region;

(b) implanting the alignment mark forming region and first well forming region with a dopant of a first conductivity type using the first resist film as the mask;

(c) removing the first resist film; and forming a second resist film to mask the first well forming region on the selective etching film, having an opening overlying the alignment mark forming region larger than the opening of the selective etching film overlying the same region;

(d) using the second resist film and selective etching film as a mask, removing a portion of the silicon substrate 2, whereby the alignment mark is formed; and removing the second resist film and selective etching film;

(e) forming a third resist film having an opening overlying the second well forming region to mask the first well forming region;

(f) implanting the second well forming region with a dopant of a second conductivity type opposite to that of the first conductivity type using the third resist film as a mask; and removing the third resist film; and (g) performing a thermal diffusion process to form a first well and a second well on the first well forming region and second well forming region, respectively.

In the abovementioned steps, the semiconductor substrate is preferably a silicon substrate and the selective etching film is preferably a silicon nitride film. In addition, the selective etching film may be formed on the semiconductor substrate having a silicon oxide film interposed there between.

The method can additionally include, subsequent to the abovementioned steps (d), the step of oxide film formation to form a silicon oxide film on a surface of the alignment mark.

In addition, the step of oxide film formation is a heat treatment process, in which the first well is formed in the first well forming region by thermally diffusing the dopant of the first conductivity type.

Moreover, the method additionally includes, subsequent to the abovementioned steps (d), the steps of forming a LOCOS formation mask having an opening overlying a LOCOS forming region on the semiconductor substrate with another silicon oxide film interposed there between, the LOCOS forming region including at least a boundary between the first well forming region and the second well forming region; performing a heat treatment to form a LOCOS oxide film in the LOCOS forming region; and removing the LOCOS formation mask.

In addition, the dopant of the second conductivity type mentioned in the steps (f) is boron.

Also described in this disclosure are semiconductor devices which are formed according to the abovementioned steps.

BRIEF DESCRIPTION OF THE DRAWINGS

The features of the present disclosure can be more readily understood from the following detailed description with reference to the accompanying drawings wherein:

FIGS. 2A through 2J are cross-sectional views illustrating the semiconductor device during various stages in the manufacturing process, in which FIGS. 2A through 2G are referred to the first embodiment of the disclosure, while FIGS. 2H through 2J are the continuation of FIGS. 2A through 2D to be referred altogether to the second embodiment;

DETAILED DESCRIPTION OF PREFERRED EMBODIMENTS

Figure 1:
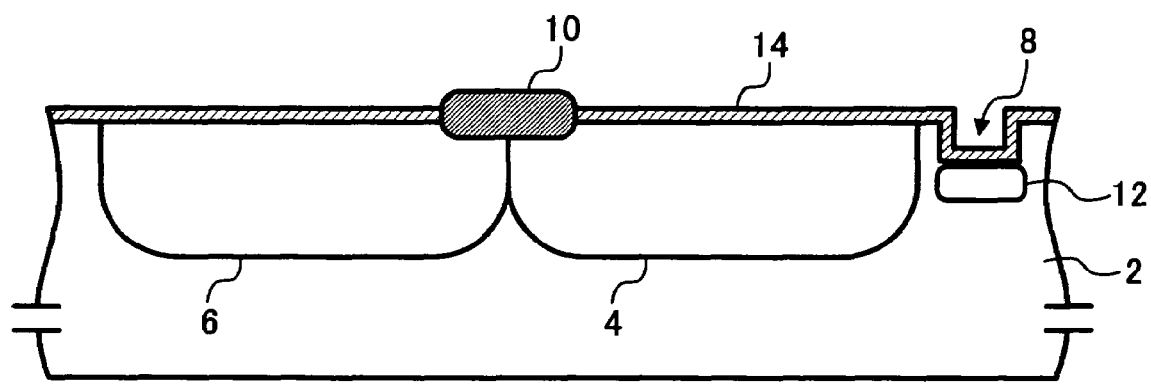
FIG. 1 is a cross-sectional view illustrating a semiconductor device according to one embodiment of the disclosure.

In the detailed description which follows, specific embodiments of the methods for manufacturing semiconductor devices including plural kinds of wells on a single semiconductor with improved alignment accuracy are described. It is understood, however, that the present disclosure is not limited to these embodiments. For example, it is appreciated that the present method may also be adaptable to any form of manufacturing semiconductor devices. Other embodiments will be apparent to those skilled in the art upon reading the following description.

In addition, in the description that follows specific terminology is used in many instances for the sake of clarity. However, the disclosure of this patent specification is not intended to be limited to the specific terminology so selected and it is to be understood that each specific element includes all technical equivalents that operate in a similar manner.

According to a general example in the present disclosure, a method for manufacturing a semiconductor device comprising two kinds of wells on a single semiconductor substrate includes primarily the steps of forming an alignment mark, and forming a first well and a second well on the first well forming region and second well forming region, respectively.

The step of forming an alignment mark specifically comprises the steps of (a) on a semiconductor substrate including thereon at least an alignment mark forming region, a first well forming region, and a second well forming region;

forming a selective etching film consisting of a material having a high selective etching ratio with respect to the semiconductor substrate;

forming further thereon a first resist film to expose the alignment mark forming region and first well forming region and to mask the second well forming region; and using the first resist film as a mask, selectively removing the portions of the selective etching film overlying the alignment mark forming region and first well forming region;

(b) implanting the alignment mark forming region and first well forming region with a dopant of a first conductivity type using the first resist film as the mask;

(c) removing the first resist film; and forming a second resist film to mask the first well forming region on the selective etching film, having an opening overlying the alignment mark forming region larger than the opening of the selective etching film overlying the same region; and (d) using the second resist film and selective etching film as a mask, removing a portion of the silicon substrate 2, whereby the alignment mark is formed.

In addition, the steps of forming the first and second wells additionally comprises the steps of, after removing the second resist film and selective etching film, (e) forming a third resist film having an opening overlying the second well forming region to mask the first well forming region;

(f) implanting the second well forming region with a dopant of a second conductivity type opposite to that of the first conductivity type using the third resist film as a mask; and removing the third resist film; and (g) performing a thermal diffusion process to form, whereby a first well and a second well on the first well forming region and second well forming region, respectively.

In the present method, it is adapted for the alignment mark forming region to be defined by forming an opening on the selective etching film using the first resist film for defining the first well forming region, as described above in the steps (a).

As a result, the first well can be formed without using the alignment mark and the number of times of aligning steps, which are generally to be carried out with a high accuracy, can decrease by one.

In addition, since LOCOS oxide film is not formed on the first well forming region, no step height is generated on the surface of the silicon substrate.

Still in addition, since the opening on the second resist is formed larger than that on the selective etching film, as described in the steps (c), the effects from the shift of second resist alignment can be obviated.

As the material for the selective etching film to be used in combination with the silicon substrate, silicon nitride is preferably selected because of its high selective etching ratio with respect to silicon as the material for the present semiconductor substrate.

The silicon nitride film on the silicon substrate is preferably formed with a silicon oxide film interposed there between. This film configuration is advantageous for preventing the stress damage by the silicon nitride film.

The present method may further include the step of oxide film formation, which is inserted between the steps (d) and (e) to form a silicon oxide film on the surface of the alignment mark.

Although the portion of the silicon substrate 2 corresponding to the surface of the alignment mark is uncovered (or exposed) immediately after the step of the alignment mark formation, the contamination, which is possibly caused by directly disposing an overlying film such as, for example, a resist film, may be obviated by forming the silicon oxide film on the surface of the alignment mark. This is achieved by a thermal oxidation process carried out in the step mentioned just above, subsequent to the steps (d).

Alternatively, since the step of oxide film formation is a part of a heat treatment process, the formation of the first well may be carried by thermally diffusing the first dopant during the heat treatment simultaneous with the formation of the oxide film on the surface of the alignment mark.

The method may further include, to be inserted between the steps (d) and (e), additional steps of forming a LOCOS formation mask having an opening overlying a LOCOS forming region on the semiconductor substrate with another silicon oxide interposed there between, such that the LOCOS forming region includes at least the boundary between the first well forming region and the second well forming region;

performing a heat treatment to form a LOCOS oxide film in the LOCOS forming region; and removing the LOCOS formation mask.

In the case when boron is used as the dopant of the second conductivity type for implanting the second well forming region to form the second well and the LOCOS oxide film is formed subsequent to the boron implantation, there gives rise to the difficulty for the boron dopant to be drawn out of the second well forming region by the LOCOS oxide film.

In the present method, therefore, this difficulty can be obviated by forming the LOCOS oxide film, prior to the boron implantation, in the LOCOS forming region including at least the boundary between the first well forming region and the second well forming region.

By the above term "LOCOS (local oxidation of silicon) oxide film" meant is a relatively thick pad of silicon oxide film, which is thermally grown in an oxidizing atmosphere on a prior silicon oxide layer by using silicon nitride to prevent oxidation of silicon in selected areas, hence, "local" oxidation.

Moreover, as another step to be performed subsequent to the step (g), the method may include the step of forming a LOCOS oxide film in a region including at least a boundary between the first and second well forming regions, in place of the aforementioned LOCOS forming steps included subsequent to the steps (d) and prior to the step (e).

The abovementioned steps may suitably be adopted for forming semiconductor devices of the disclosure, including at least two kinds of wells and an alignment mark on a single semiconductor substrate, in which the alignment mark is formed in the region different from the two kinds of wells.

In addition, the semiconductor devices are characterized by a dopant diffusion region formed, under the alignment mark, having a concentration of the dopant of the first conductivity type higher than the region surrounding the dopant diffusion region.

As described herein above, the present method is configured to perform the steps of, subsequent to the formation of a selective etching film on the semiconductor substrate, forming an opening on the selective etching film overlying an alignment mark forming region using a first resist film as a mask for defining a first well forming region and the alignment mark forming region, implanting the first well forming region with a dopant of a first conductivity type and removing the first resist film, forming a second resist film to mask at least the first well forming region, having an opening overlying the alignment mark forming region larger than the opening of the selective etching film overlying the same region, and forming the alignment mark by performing an etching process using the second resist film and selective etching film as a mask.

As a result, the methods of the present disclosure can offer several advantages over the previous method. For example, the step of positioning the first well can be eliminated, which is more advantageous in comparison with the positioning the first and second well forming regions with respect to the alignment mark.

In addition, since the opening on the second resist film is formed larger than that on the selective etching film to serve as a mask for forming the alignment mark, undue effects of errors in aligning the second resist film can decrease during the process for forming the alignment mark, the number of times of aligning steps with a high accuracy can decrease by one, and the occurrence probability of alignment errors can also be reduced.

Still in addition, no step height is generated on the surface covering the first and second well regions, since no LOCOS oxide film is required on the first well N in comparison to previous methods which utilize the LOCOS oxide film.

Moreover, the stress damage to the silicon substrate caused by the silicon nitride film can be prevented by forming a silicon oxide film interposed there between.

In addition, the contamination, which is possibly caused by directly disposing an overlying film such as a resist film, may be obviated by forming the silicon oxide film on the surface of the alignment mark, as carried out by the aforementioned thermal oxidation step subsequent to the steps (d).

The oxide film on the surface of the alignment mark may alternatively be formed by a thermal diffusion process simultaneous with the formation of the first well subsequent to the implantation of the first dopant into the first well forming region.

In addition, by forming the LOCOS oxide film, prior to the boron implantation, in the LOCOS forming region including at least the boundary between the first well forming region and the second well forming region, the difficulty can be obviated for the second dopant such as boron ions, in particular, to be drawn out of the second well forming region by the LOCOS oxide film.

Having described the present disclosure in general, several preferred embodiments of the semiconductor device will be described herein below according to the present disclosure with reference to FIGS. 1 through 4B.

FIG. 1 is a cross-sectional view illustrating a semiconductor device according to a first preferred embodiment of the disclosure.

Referring to FIG. 1, the semiconductor device includes at least an N well region (first well) 4 formed on a silicon substrate (semiconductor substrate) 2, a P well region 6 formed also on the silicon substrate 2 adjacent to the N well region, and an alignment mark 8 formed in the region different from the N and P well regions.

In addition, a LOCOS (local oxidation of silicon) film 10 is formed in the region including the N and P well regions on the silicon substrate 2.

The N well region 4 contains N type impurities such as, for example, implanted phosphorus, while the P well region 6 contains P type impurities such as, for example, implanted boron.

An N type impurity diffusion region 12 is formed in the region immediately below the alignment mark 8 by implanting the same phosphorus impurities as N well region 4.

Moreover, a silicon oxide film 14 is formed on the surface of the silicon substrate 2 for masking the N well region 4, P well region 6, and the alignment mark 8.

Incidentally, no step height is generated on the surface of the silicon substrate 2 masking the N well region 4 and P well region 6.

The method of manufacturing the semiconductor device of the first embodiment will be described hereinbelow according to a preferred embodiment.

FIGS. 2A through 2G are cross-sectional views illustrating the semiconductor device during various stages in the manufacturing process according to the first embodiment of the disclosure.

The sentence blocks (a) through (g) in the following description will be referred to FIGS. 2A through 2G, respectively. In these drawings there broadly divided into three regions from left to right are a P well forming region 16, N well forming region 18, and an alignment mark forming region 20.

(a) A silicon oxide film 22 is formed on the silicon substrate 2 having a thickness in the range of typically 10 to 100 nm, 100 nm in this embodiment, and a silicon nitride film 24 as a selective etching film is subsequently formed having a thickness in the range of typically 10 to 100 nm, 100 nm in the embodiment case, on the silicon oxide film 22.

In addition, a first resist film 26 is formed on the silicon nitride film 24 having a thickness of about 1000 nm.

(b) By performing a patterning process according to the well-known photolithography method, the portions of the first resist film 26 are removed to form openings overlying the N well forming region 18 and alignment mark forming region 20.

With the use of thus prepared first resist film 26 as a mask, the portions of the silicon nitride film 24 overlying the N well forming region 18 and alignment mark forming region 20 are removed.

Thereafter, with the use of the first resist film 26 as a mask, N type impurities such as, for example, phosphorus ions (first impurities which are shown with "x" marks in FIG. 2B) are implanted into the N well forming region 18 and alignment mark forming region 20 under the conditions of an acceleration voltage of 180 keV and a dose of approximately $1.0 \times 10^{13}$ $cm^{-2}$.

As a result, the phosphorus ions are implanted into the region centering at the depth of about 100 nm from the surface of the silicon substrate 2 and having an extent of the order of 10 nm.

(c) After removing the first resist film 26, a second resist film 28 is formed having a thickness of about 1000 nm on the silicon oxide film 22 and silicon nitride film 24.

By performing a photolithography patterning process, the portion of the second resist film 28 is removed to form an opening overlying the alignment mark forming region 20 such that the opening 28a of the second resist film 28 is larger than the previous opening 24a of the silicon nitride film 24 over the same region 20.

In the case where the alignment mark is formed to be straight linear having a width ranging from 2 to 10 µm and a length ranging from 50 to 100 µm, the patterning process is preferably performed such that the width and length of the second resist opening 28a are provided by at least several microns larger than the silicon nitride opening 24a.

As a result of thus formed second resist opening 28a having the width and length of the second resist opening 28a larger than the silicon nitride opening 24a, the silicon nitride film 24 may be used as the etching mask even when the positioning of the second resist opening 28a is unduly shifted from its predetermined position, whereby the effects of possible errors (or deviations) in aligning the second resist film 28 are reduced during the process for forming the alignment mark.

Figure 2A:
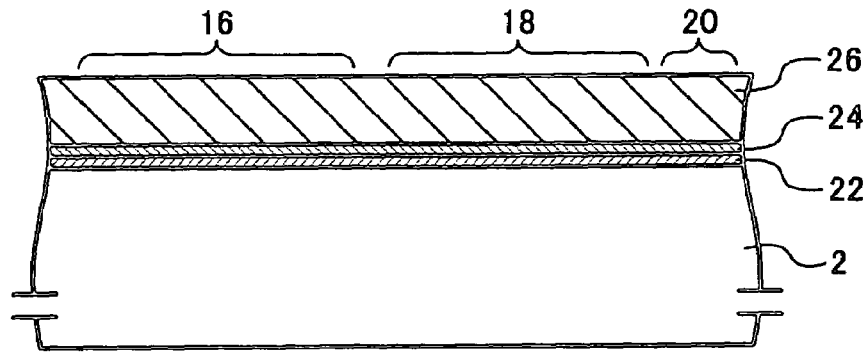
Figure 2B:
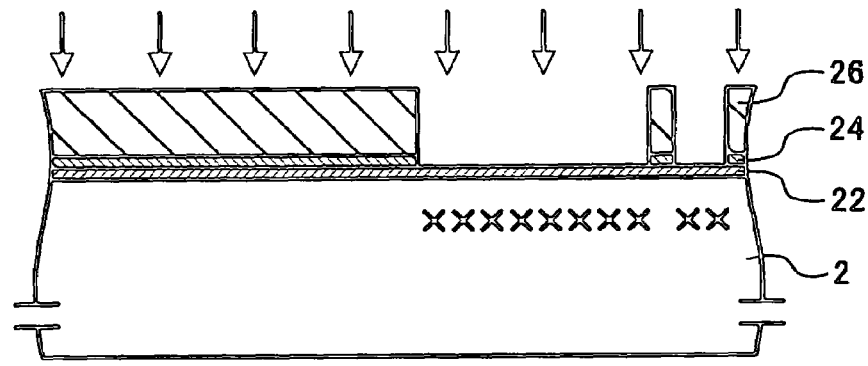
Figure 2C:
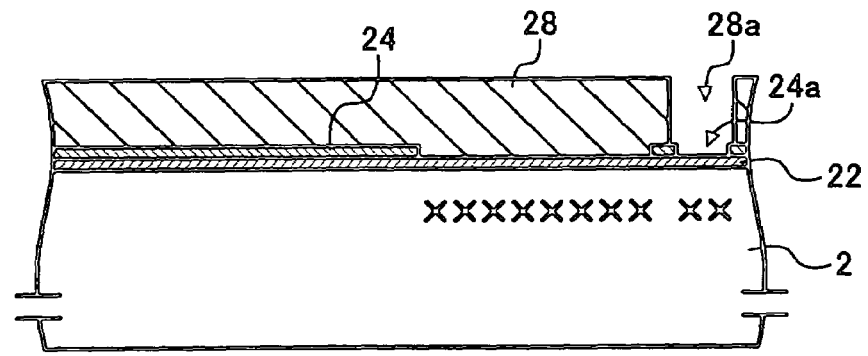
Figure 2D:
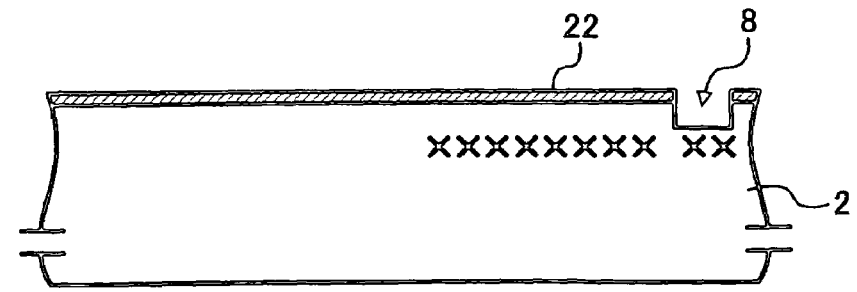
Figure 2E:
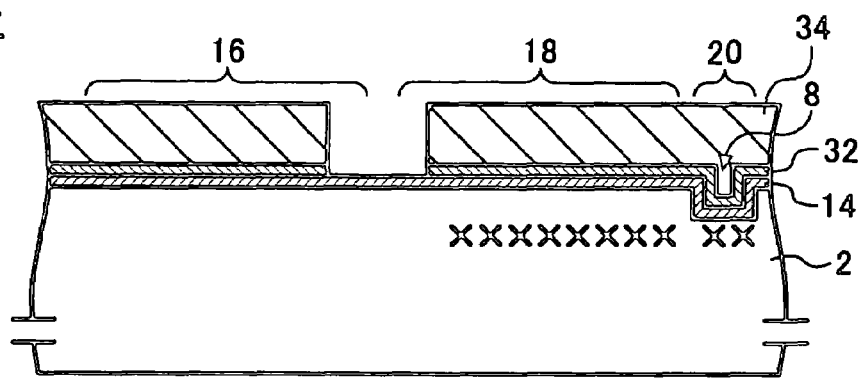
Figure 2F:
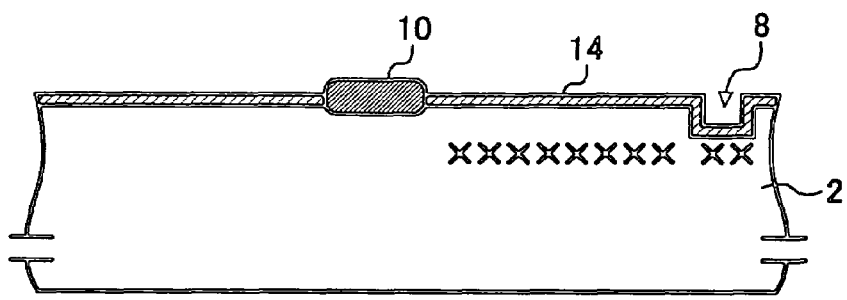
Figure 2G:
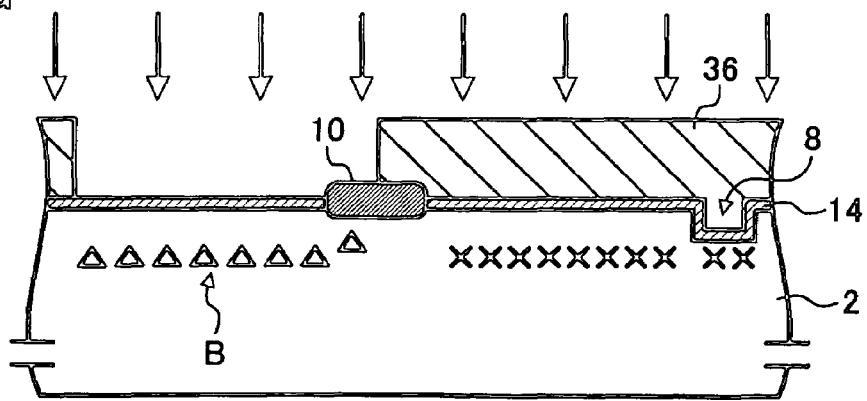

(d) By performing an etching process such as, for example, an anisotropic etching on the silicon oxide film 22 and silicon substrate 2 using the second resist film 28 and silicon nitride film 24 as a mask, the alignment mark 8 is formed (FIG. 2D).

It may be noted that the depth presently formed by the etching process is in the order of 100 nm and that phosphorus ions previously implanted during the process (b) remain in the region under the alignment mark 8.

In addition, since the silicon nitride film 24 is used as a mask in the etching process as described earlier, the alignment mark 8 may be formed at the precise location unaffected by alignment errors possibly caused by the second resist film 28.

Following the formation of the alignment mark 8, the second resist film 28 and silicon nitride film 24 are removed.

(e) After removing the silicon oxide film 22, the surface of the silicon substrate 2 is subjected to thermal oxidation process to form a second silicon oxide film 14 having a thickness of about 100 nm.

In addition, a silicon nitride film 32 serving as a mask for LOCOS (local oxidation of silicon) formation is formed on the second silicon oxide film 14 having a thickness of about 100 nm.

Thereafter, a second resist film 34 is formed on the silicon nitride film 32 with a thickness of about 100 nm. The second resist film 34 is provided with an opening overlying the region on which LOCOS is to be formed. Using the second resist film 34 as a mask, the portion of the silicon nitride film 32 in the LOCOS forming region is removed.

(f) Following the removal of the second resist film 34, the surface of the structure is subjected to a thermal oxidation process for two hours at 1000° C. to form a LOCOS oxide film 10, and the silicon nitride film 32 is subsequently removed. The thickness of thus formed LOCOS oxide film 10 is preferably in the range between 400 and 600 nm.

(g) A third resist film 36 is formed, which is provided with an opening overlying the P well forming region 16 on the silicon substrate 2, on the second silicon oxide film 14 and LOCOS oxide film 10.

Using the third resist film 36 as a mask, P type impurities such as, for example, boron ions (second impurities which are shown with "Δ" marks in FIG. 2G) are implanted into the P well forming region 16 under the conditions of an acceleration voltage of 180 keV and a dose of approximately $1.0 \times 10^{13}$ $cm^{-2}$.

After removing the third resist 36, the structure is subjected to a thermal diffusion process for one hour at 1200° C. to form N well region 4 and P well region 6. The ions implanted into the N well region 4 and P well region 6 are diffused into the region extending to the depth of about 2 µm from the substrate surface.

In addition, with the phosphorus ions which are previously implanted to remain in the region under the alignment mark 8, an impurity diffusion region 12 is formed also during the thermal diffusion process.

Thus, the semiconductor device with the twin-well structure of FIG. 1 can be formed.

Since the alignment mark 8 is formed by first removing the portions of the silicon nitride film 24 overlying the alignment mark forming region 20 as described in the process (b) in the present embodiment, and performing the etching process on the silicon oxide film 22 and silicon substrate 2 using the silicon nitride film 24 as a mask as described in the process (d), the step of alignment otherwise necessary for implanting impurities into the N well forming region 18 can be eliminated.

As a result, the number of times of aligning steps, which are generally to be carried out with high accuracy, can decrease by one, whereby the occurrence probability of alignment errors can also decrease.

In addition, since LOCOS oxide film is not formed on the N well forming region 18, no step height is generated on the surface of the silicon substrate 2 covering the N well region 4 and P well region 6. As a result, the difficulty in focusing on the mask during aligning observation for forming gate electrodes and concomitant errors in finished measurements can be obviated, which may take place during the gate electrode formation.

Moreover, the LOCOS oxide film 10 is formed prior to the boron ion implantation into the P well forming region 16. This is of advantage to prevent boron ions, which are previously implanted into the P well forming region 16, from being drawn out by the LOCOS oxide film 10.

Next, a further method of manufacturing the semiconductor device will be described according to another preferred embodiment.

Since the aforementioned processes (a) through (d) in reference to FIGS. 2A through 2D are also adopted in the present embodiment, the details thereof are abbreviated herein.

Figure 2H:
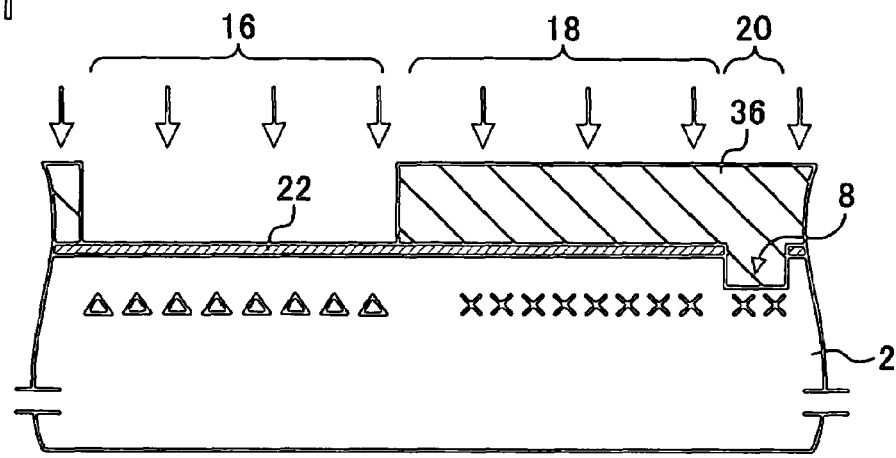
Figure 2I:
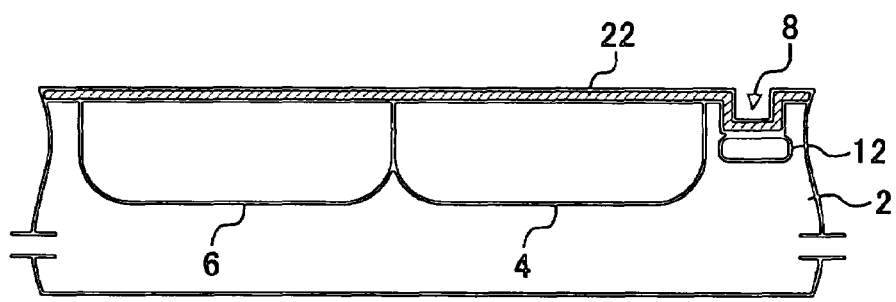
Figure 2J:
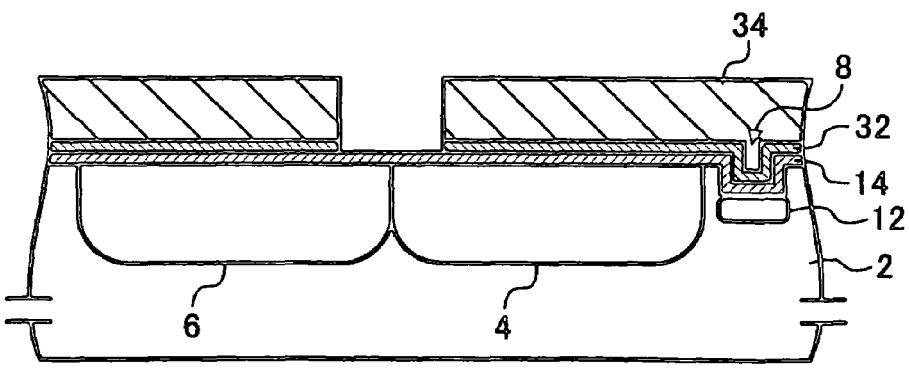

In addition, FIGS. 2H through 2J are the continuation of FIGS. 2A through 2D for describing the method according to this embodiment. Still in addition, the sentence blocks (h) through (j) in the following description will be referred to FIGS. 2H through 2J, respectively.

In these drawings, there broadly divided into three regions from left to right are a P well forming region 16, N well forming region 18, and an alignment mark forming region 20. The components and elements similar to those in FIGS. 2A through 2D are shown with identical numerical representations.

(h) According to the same processes as the aforementioned processes (a) through (d) in reference to FIGS. 2A through 2D, a silicon oxide film 22 is formed on a silicon substrate 2, and phosphorus ions ("x" marks in FIG. 2B) are implanted into an N well forming region 18 and alignment mark forming region 20, whereby an alignment mark 8 is formed in an alignment mark forming region 20.

A third resist film 36 is formed, which is provided with an opening overlying the P well forming region 16 on the silicon oxide film 22.

Thereafter, using the third resist film 36 as a mask, P type impurities such as, for example, boron ions ("Δ" marks in FIG. 2H) are implanted into the P well forming region 16 under the conditions of an acceleration voltage of 180 keV and a dose of approximately $1.0 \times 10^{13}$ cm$^{-2}$.

(i) After removing the third resist 36, the structure is subjected to a thermal diffusion process for one hour at 1200° C. to thereby form the N well 4 and P well 6. The ions implanted into the N well region 4 and P well region 6 are diffused into the region extending to the depth of about 2 μm from the substrate surface.

In addition, with the phosphorus ions which are previously implanted to remain in the region under the alignment mark 8, an impurity diffusion region 12 is formed also during the thermal diffusion process.

(j) After removing the silicon oxide film 22, a silicon oxide film 14 is formed on the surface of the silicon substrate 2 through thermal oxidation with a thickness of about 100 nm. In addition, a silicon nitride film 32 is formed on the silicon oxide film 14 having a thickness of about 100 nm.

A resist film 34 is subsequently formed on the silicon nitride film 32 with a thickness of about 100 nm. The resist film 34 is provided with an opening overlying the LOCOS forming region. Using the resist film 34 as a mask, the portion of the silicon nitride film 32 in the LOCOS forming region is removed.

Thereafter, the surface of the structure is subjected to a thermal oxidation process for two hours at 1000° C. to form a LOCOS oxide film 10 in the LOCOS forming region, and the silicon nitride film 32 is subsequently removed. The thickness of thus formed LOCOS oxide film 10 is preferably in the range between 400 and 600 nm.

Thus, the semiconductor device with the twin-well structure of FIG. 1 is completed.

Figure 3A:
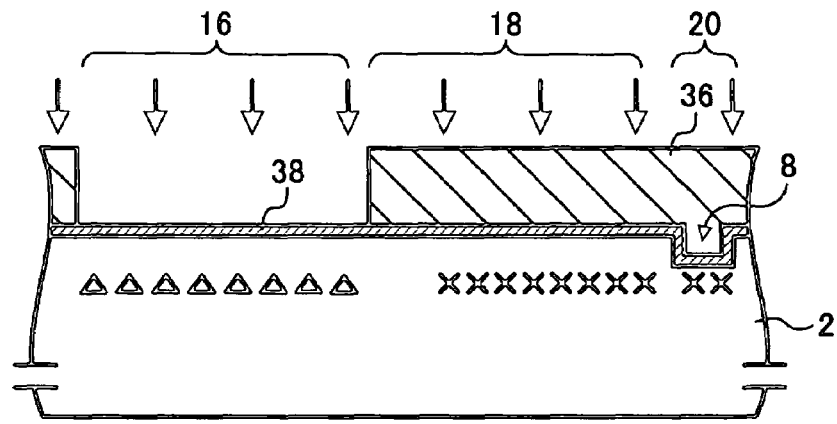
FIGS. 3A and 3B are cross-sectional views illustrating the semiconductor device during the manufacturing process as the modification to the steps of forming the resist films in the semiconductor device of the second embodiment.

The third resist film 36 is formed, during the process (h) in the present embodiment, directly on an uncovered face of the silicon substrate 2 in the location of the alignment mark. However, this process for forming the third resist film 36 may alternatively be performed subsequent to the formation of an oxide film 38 on the silicon substrate 2, as illustrated in FIG. 3A.

Figure 3B:
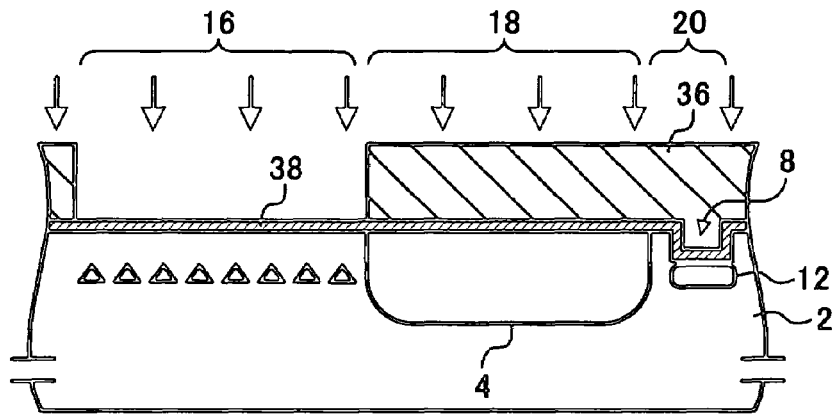

Still alternatively, the formation through a thermal diffusion process of N well region 4 in the N well forming region 18 may be carried out prior to the formation of the third resist film 36, as shown in FIG. 3B. During the thermal diffusion process, an oxide film 38 is formed on the surface of the alignment mark.

By forming the oxide film 38 on the abovementioned uncovered region prior to forming the third resist film 36, the contamination of the silicon substrate 2 can be prevented.

Incidentally, the silicon oxide film 22 may or may not be removed before forming the oxide film 38.

Although the implantation into the N well forming region 18 and alignment mark forming region 20 with phosphorus ions is carried out in the abovementioned embodiments prior to the implantation into the P well forming region 16, the method of the implantation is not limited only to that method.

For example, the method may alternatively be carried out during the process (b) such that boron ions are implanted into the N well forming region 18 and alignment mark forming region 20. In this case, an impurity diffusion region 12 is formed of P type immediately under the alignment mark 8.

Also in the embodiments, the first and second well regions have been assumed to be of the conductivity type different with each other. However, this is not intended to limit the disclosure and the conductivity type may alternatively be the same in the both well regions.

Although several examples of a method of forming the semiconductor devices of the twin-well structure have been described, the methods may also be applied to the devices provided with three or more wells on a single semiconductor substrate, particularly in use for sharing one etching selection film of silicon nitride for forming these wells.

Figure 4A:
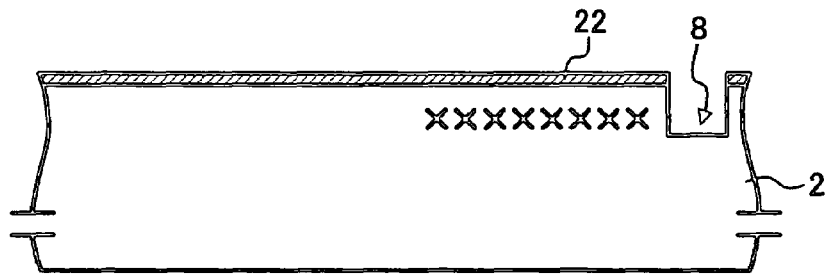
FIGS. 4A and 4B are cross-sectional views illustrating the semiconductor device during the manufacturing process as the modification to the steps of implanting the first impurity ions into the region under the alignment mark of the second embodiment.

In addition, although the phosphorus ions are implanted during the process (b) into the region deeper than the depth for forming the alignment mark 8 (FIG. 2D) in the embodiments, this is not intended to be limiting the methods of the disclosure. That is, the first impurity ions may alternatively be implanted into the region having a smaller depth than the bottom of the alignment mark 8 as shown in FIG. 4A.

Figure 4B:
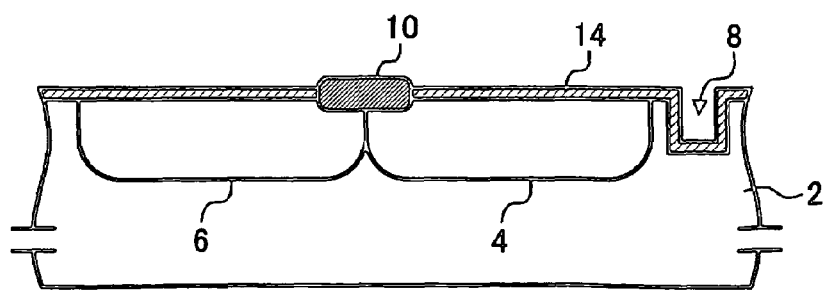
Figure 5A:
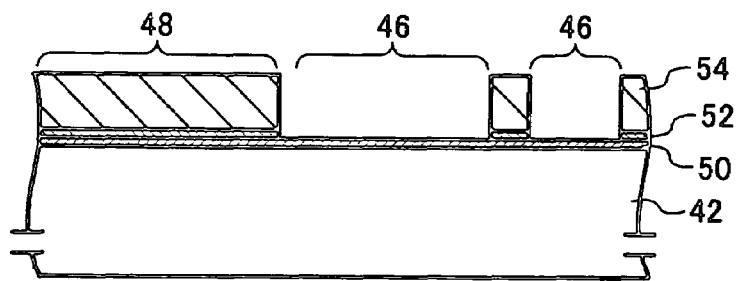
FIGS. 5A through 5F are cross-sectional views illustrating a semiconductor device during various stages in the manufacturing process according to a method previously known utilizing self-alignment techniques.
Figure 5B:
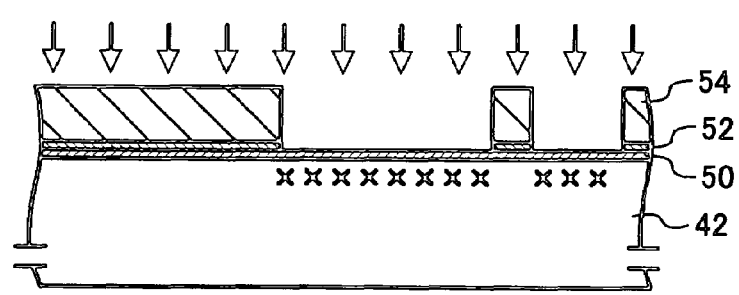
Figure 5C:
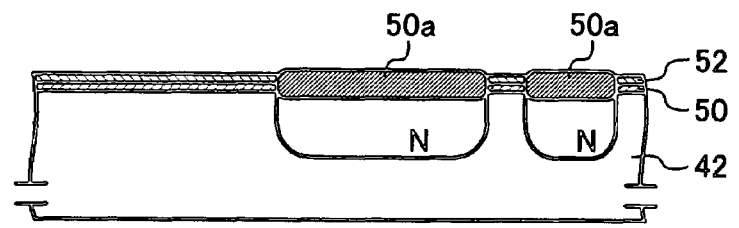
Figure 5D:
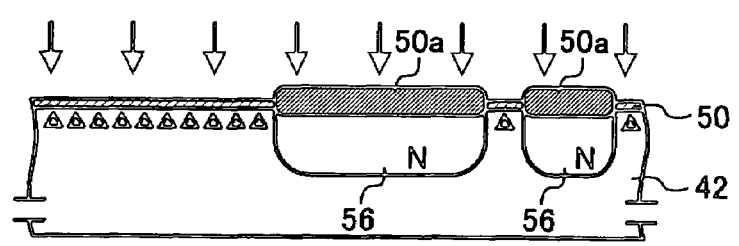
Figure 5E:
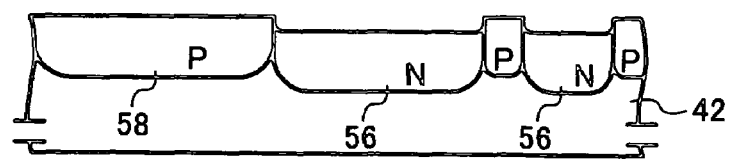
Figure 5F:
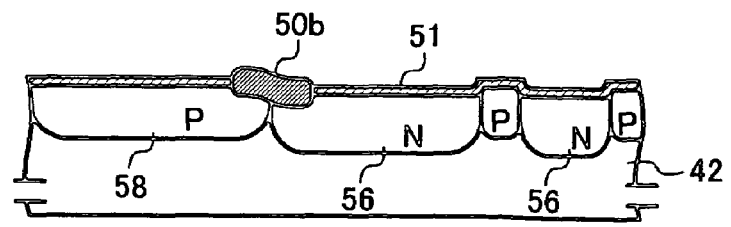
Figure 6A:
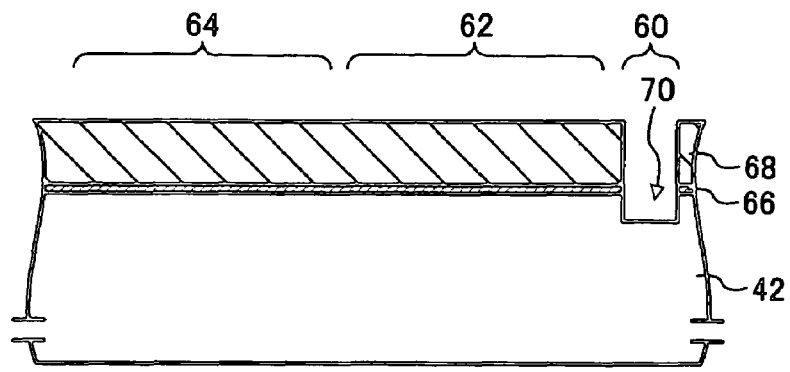
FIGS. 6A through 6E are cross-sectional views illustrating a semiconductor device during various stages in the manufacturing process according to another method previously known using an alignment mark.
Figure 6B:
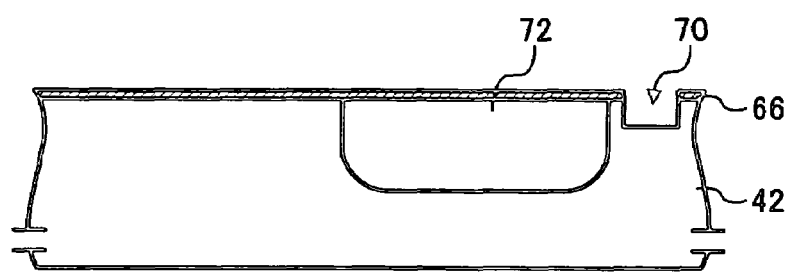
Figure 6C:
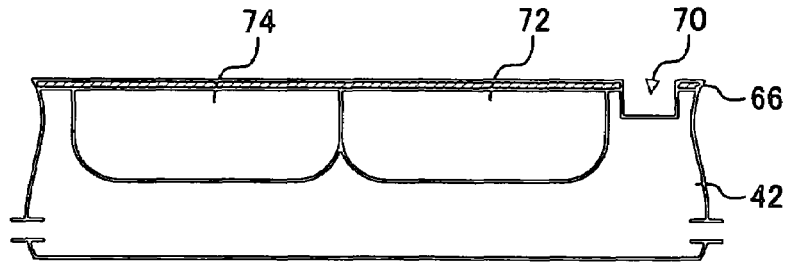
Figure 6D:
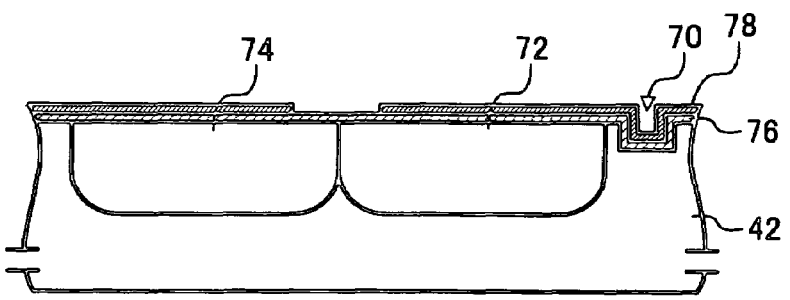
Figure 6E:
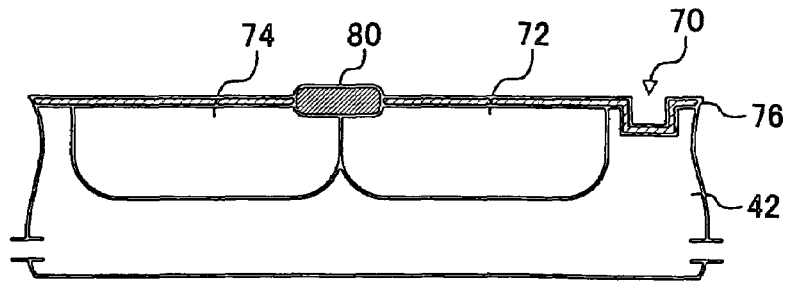

In this case, no first impurity ion remains in the region immediately below the alignment mark 8 after the formation thereof, no impurity diffusion region is therefore formed after the thermal diffusion process as shown in FIG. 4B.

Still in addition, although the third resist film 36 is formed to mask the alignment mark forming region 20 and N well forming region 18 in the embodiments, the film 36 may alternatively be formed at least having an opening overlying the P well forming region 16 and masking the N well forming region 18, that is, having an opening overlying the alignment mark forming region 20.

In addition, although the second resist film 28 is formed masking the second well forming region 16 in the embodiments, the film 28 may alternatively be formed so as not to mask the region 16. In this case, the silicon nitride film 24 serves as a mask during the process for forming the alignment mark.

Moreover, it should be noted that the aforementioned twin-well structure is cited only for illustration purposes, and that other structural embodiments may alternatively be contemplated, in which the N well 4, P well 6, and alignment mark 8 assume a configuration different from those described above.

It should be apparent from the above description including the examples disclosed that the method and devices of the present disclosure can offer several advantages over the previous methods and devices.

For example, as a result of the aforementioned configuration and sequence of the steps of the disclosure for forming the selective etching film, the opening overlying the alignment mark forming region, the second resist film to mask at least the first well forming region, and alignment mark, in that order; the step of positioning the first well can be eliminated, which is more advantageous in comparison with the positioning the first and second well forming regions with respect to the alignment mark.

In addition, since the opening on the second resist film is formed larger than that on the selective etching film to serve as a mask for forming the alignment mark, the effects of errors in aligning the second resist film can decrease during the process for forming the alignment mark, the number of aligning steps with a high accuracy can decrease by one and the occurrence probability of alignment errors can also be reduced.

Still in addition, no step height is generated on the surface covering the first and second well regions, since no LOCOS oxide film is required on the first well N in comparison to previous methods which utilize the LOCOS oxide film.

Moreover, the stress damage to the silicon substrate by the silicon nitride film can be prevented by forming a silicon oxide film interposed there between.

In addition, the contamination, which is possibly caused by directly disposing an overlying film such as a resist film, may be obviated by forming the silicon oxide film on the surface of the alignment mark, as carried out by the aforementioned thermal oxidation step subsequent to the steps (d).

The oxide film on the surface of the alignment mark may alternatively be formed by a thermal diffusion process simultaneous with the formation of the first well subsequent to the implantation of the first dopant into the first well forming region.

In addition, by forming the LOCOS oxide film, prior to the boron implantation, in the LOCOS forming region including at least the boundary between the first well forming region and the second well forming region, the difficulty can be obviated for the second dopant such as boron ions, in particular, to be drawn out of the second well forming region by the LOCOS oxide film.

Moreover, the semiconductor devices of the disclosure are suitably formed according to the abovementioned steps, including at least two kinds of wells and an alignment mark on a single semiconductor substrate, in which the alignment mark is formed in the region different from the two kinds of wells.

In addition, the semiconductor devices can be formed with improved alignment accuracy simultaneously with obviating the generation of step height between the wells.

While several preferred embodiments have been described in this disclosure, it will be understood that it is not intended to limit the disclosure to the embodiments, inclusive of materials, components and structure. On the contrary, it is intended to cover such modifications or variations as may come within the scope of the following claims. For example, elements and/or features of different illustrative embodiments may be combined with each other and/or substituted for each other within the scope of this disclosure and appended claims.

This application claims priority to Japanese Patent Application No. 2005-68267, filed with the Japanese Patent Office on Mar. 10, 2005, the entire contents of which are hereby incorporated by reference.

What is claimed is:

1. A method for forming a semiconductor device comprising at least two kinds of wells on a single semiconductor substrate, comprising the steps of:
    (a) providing a semiconductor substrate including thereon an alignment mark forming region, a first well forming region, and a second well forming region, said first well forming region being between said alignment mark forming region and said second well forming region;
    a selective etching film on said semiconductor substrate;
    further thereon a first resist film, said first resist film having an opening overlying said alignment mark forming region and said first well forming region and masking said second well forming region; and
    removing, with said first resist film serving as a mask, portions of said selective etching film overlying said alignment mark forming region and said first well forming region;
    (b) implanting said alignment mark forming region and said first well forming region between said alignment mark forming region and said second well forming region with a first dopant prior to formation of an alignment mark in said alignment mark forming region, said first resist film serving as the mask over said second well forming region;
    (c) removing said first resist film; and
    forming a second resist film masking said first well forming region on said selective etching film, said second resist film having an opening overlying said alignment mark forming region larger than the opening of said selective etching film overlying a same region;
    (d) removing, with said second resist film and said selective etching film serving as a mask, a portion of said silicon substrate to form said alignment mark; and
    then removing said second resist film and said selective etching film;
    (e) forming a third resist film having an opening overlying said second well forming region, said third resist film masking said first well forming region;
    (f) implanting, with said third resist film serving as a mask, said second well forming region with a second dopant; and
    removing said third resist film; and
    (g) performing a thermal diffusion process to form a first well and a second well on said first well forming region and said second well forming region, respectively.

2. The method according to claim 1, wherein said semiconductor substrate comprises silicon and said selective etching film comprises silicon nitride.

3. The method according to claim 1, wherein said selective etching film is formed on said semiconductor substrate with a silicon oxide film therebetween.

4. The method according to claim 1, further comprising, subsequent to the steps (d) and prior to the step (e), the step of forming a silicon oxide film on a surface of said alignment mark.

5. The method according to claim 4, wherein a heat treatment process is applied in said step of forming the silicon oxide film, and wherein said first well is formed in said first well forming region by thermally diffusing said first dopant during said heat treatment process.

6. The method according to claim 1, further comprising, subsequent to the step (d) and prior to the step (e), the steps of:
    forming a LOCOS forming mask having an opening overlying a LOCOS forming region on said semiconductor substrate with a silicon oxide film therebetween, said LOCOS forming region including at least a boundary between said first well forming region and said second well forming region;
    performing a heat treatment to form a LOCOS oxide film in said LOGOS forming region; and
    removing said LOCOS forming mask.

7. The method according to claim 1, wherein said second dopant is boron.

8. The method according to claim I, further comprising, subsequent to the step (g), the step of:

forming a LOCOS oxide film in a region including at least a boundary between said first well forming region and said second well forming region.

9. The method according to claim 1, wherein said selective etching film is fanned of a material having a high selective etching ratio with respect to said semiconductor substrate.

10. The method according to claim 2, further comprising, subsequent to the step (d) and prior to the step (e), the step of forming a silicon oxide film on a surface of said alignment mark.

11. The method according to claim 2, further comprising, subsequent to the step (d) and prior to the step (e), the steps of:
forming a LOCOS forming mask having an opening overlying a LOCOS forming region on said semiconductor substrate with a silicon oxide film therebetween, said LOCOS forming region including at least a boundary between said first well forming region and said second well forming region:
performing a heat treatment to form a LOCOS oxide film in said LOCOS forming region; and
removing said LOCOS forming mask.

12. The method according to claim 2, further comprising, subsequent to the step (g), the step of:
forming a LOCOS oxide film in a region including at least a boundary between said first well forming region and said second well forming region.

13. The method according to claim 3, further comprising, subsequent to the step (d) and prior to the step (e), the step of forming a silicon oxide film on a surface of said alignment mark.

14. The method according to claim 3, further comprising, subsequent to the step (d) and prior to the step (e), the steps of:
forming a LOCOS forming mask having an opening overlying a LOCOS forming region on said semiconductor substrate with a silicon oxide film therebetween, said LOCOS forming region including at least a boundary between said first well forming region and said second well forming region;
performing a heat treatment to form a LOCOS oxide film in said LOCOS forming region; and
removing said LOCOS Forming mask.

15. The method according to claim 3, further comprising, subsequent to the step (g), the step of:
forming a LOCOS oxide film in a region including at least a boundary between said first well forming region and said second well forming region.

16. The method according to claim 1, further comprising forming a dopant diffusion region, under said alignment mark, wherein the dopant diffusion region has a first concentration that is higher than a second concentration of a surrounding region of said dopant diffusion region.

17. A semiconductor device formed by the method of claim 1, said semiconductor device comprising said first and second wells and said alignment mark on said semiconductor substrate, said first well containing said first dopant being between said alignment mark containing said first dopant and said second well containing said second dopant.

18. The semiconductor device according to claim 17, wherein a dopant diffusion region is formed, under said alignment mark, and the dopant diffusion region has a first concentration that is higher than a second concentration of a surrounding region of said dopant diffusion region.

* * * * *